(12) United States Patent
Chung et al.

(10) Patent No.: US 8,557,715 B2
(45) Date of Patent: Oct. 15, 2013

(54) MARKING $CO_2$ LASER-TRANSPARENT MATERIALS BY USING ABSORPTION-MATERIAL-ASSISTED LASER PROCESSING

(75) Inventors: Chen-Kuei Chung, Tainan County (TW); Meng-Yu Wu, Taichung (TW); En-Jou Hsiao, Yunlin County (TW); Shih-Lung Lin, Changhua County (TW)

(73) Assignee: National Cheng Kung University, Tainan (TW)

( * ) Notice: Subject to any disclaimer, the term of this patent is extended or adjusted under 35 U.S.C. 154(b) by 425 days.

(21) Appl. No.: 12/839,186

(22) Filed: Jul. 19, 2010

(65) Prior Publication Data

US 2010/0308441 A1 Dec. 9, 2010

Related U.S. Application Data (63) Continuation-in-part of application No. 11/723,508, filed on Mar. 20, 2007, now abandoned.

(30) Foreign Application Priority Data

Jul. 7, 2006 (TW) .............................. 95124898 A (51) Int. Cl.
*H01L 21/31* (2006.01)
(52) U.S. Cl.
USPC .......................... 438/765; 438/771; 438/795
(58) Field of Classification Search
USPC ............. 438/535, 765, 771, 795; 219/121.85; 430/130, 902, 945
See application file for complete search history.

(56) References Cited

U.S. PATENT DOCUMENTS 5,610,104 A 3/1997 Mitchell
5,877,064 A 3/1999 Chang
(Continued)

FOREIGN PATENT DOCUMENTS

JP 11260675 9/1999
TW 350797 1/1999
(Continued)

OTHER PUBLICATIONS

Ogura et al., "Hole Drilling of Glass Substrates with a CO2 Laser," Japanese Journal of Applied Physics, vol. 42, May 2003, pp. 2881-2886.

(Continued)

*Primary Examiner* — Hsien Ming Lee
(74) *Attorney, Agent, or Firm* — Muncy, Geissler, Olds & Lowe, PLLC (57) ABSTRACT

The present invention relates to a $CO_2$ laser-transparent material having a mark on the surface thereof and the method for making the same. The method includes the following steps: providing a first substrate, which has a top surface and a bottom surface; providing a second substrate which has a top surface; putting the bottom surface of the first substrate on the top surface of the second substrate; irradiating a $CO_2$ laser beam to the top surface of the second substrate by passing through the top surface and the bottom surface of the first substrate; and forming a mark on the bottom surface of the first substrate. The material of the mark is oxide of the second substrate or the same as the material of the second substrate. Whereby the cheap $CO_2$ laser is utilized to form the mark on the first substrate, and the mark can be erased easily by a proper chemical for recycling the first substrate.

27 Claims, 6 Drawing Sheets

(56) References Cited

U.S. PATENT DOCUMENTS

| | | |
|---|---|---|
| 6,248,973 B1 | 6/2001 | Matsumura |
| 6,312,876 B1 | 11/2001 | Huang |
| 6,420,245 B1 | 7/2002 | Manor |
| 6,562,698 B2 | 5/2003 | Manor |
| 2006/0269723 A1 | 11/2006 | Kager |
| 2007/0287266 A1* | 12/2007 | Chung et al. .......... 438/460 |

FOREIGN PATENT DOCUMENTS

| TW | 359885 | 6/1999 |
|---|---|---|
| TW | 434749 B | 5/2001 |
| TW | 200412477 | 7/2004 |
| TW | 200500821 | 1/2005 |
| TW | I233197 | 5/2005 |
| TW | 200538304 | 12/2005 |

OTHER PUBLICATIONS

Chung et al., "Silicon micromachining by CO2 laser," IEEE Conference of Nano/Micro Engineered and Molecular Systems, Nanotechnology Countil, Zhuhai, China, 2006, pp. 1445-1448.

Yang et al., "The early stages of silicon surface damage induced by pulsed CO2 laser radiation: an AFM study," Appl. Surf. Sci., 222, 365, 2004.

Wang et al., "Controllable periodic structure on silicon wafer by CO2 laser irradiation," Appl. Surf. Sci., 186, 594, 2002.

* cited by examiner

Full Scale 2142 cts Cursor,0.000 keV          keV

MARKING $CO_2$ LASER-TRANSPARENT MATERIALS BY USING ABSORPTION-MATERIAL-ASSISTED LASER PROCESSING

CROSS REFERENCE TO RELATED APPLICATIONS

This application is a continuation-in-part of U.S. Ser. No. 11/723,508, filed Mar. 20, 2007 now abandoned, which claims priority under 35 U.S.C. §119(a) on Patent Application No(s). 095124898, filed in Taiwan, Republic of China on Jul. 7, 2006, the entire contents of which are hereby incorporated by reference.

BACKGROUND OF THE INVENTION

1. Field of Invention

The present invention relates to a marking method, and more particularly, to a method for forming a mark on the surface of a $CO_2$ laser-transparent material.

2. Description of the Related Art

At present, laser is a marking technique widely used in the industry, and is applied to materials such as plastic, rubber, ceramics, metal, and silicon wafer. Compared with conventional manners, for example, mechanical engraving, chemical etching, screen printing, and ink printing, laser marking has the advantages of rapid production, high flexibility, and being controllable via a computer system. In addition, a prominent characteristic of laser marking is the permanence of the mark generated by a laser on the surface of a workpiece.

There are many kinds of lasers and the femtosecond laser, excimer laser, or Nd:YAG laser are mostly used in silicon wafer marking. However, these lasers are generally very expensive, and the processing mechanism thereof is ablating the surface of the silicon wafer with a laser beam of high energy, which may damage the surface structure of the silicon wafer and result in many flying minute particles, i.e., the so-called "splashing fragments". The fragments are prone to be attached to the silicon wafer, thus becoming difficult to erase. When proceeding to the subsequent device circuit process, a grip head is used to fix the edge of the silicon wafer. However, the clamping force is easy to make the residual fragments fall off and cause another splashing, which not only contaminates the process, but also severely affects the yield and quality of the product. Moreover, these lasers remove the surface of the product to form a mark, so the mark cannot be re-made, and once marked incorrectly, the product will be abandoned for uselessness, and the material cannot be recycled.

Moreover, in the conventional fabrication process of semiconductor devices, the marking process is generally performed after the silicon wafer is diced into chips. As the technique is being constantly updated and the integrated circuits are becoming lighter, thinner, and smaller, the processing technique has also evolved into dicing the wafer after marking, so as to improve the efficiency of production and operation. However, as the size of the silicon wafer is getting larger, the thickness thereof stays unchanged or becomes smaller. Therefore, when the surface of the silicon wafer is ablated with a laser beam of high energy, a large amount of stress is easily accumulated on the surface of the silicon wafer, resulting in deformation and warping thereof. Though the stress can be eliminated by high temperature annealing, the basic property of the silicon wafer is greatly affected, which is disadvantageous for the subsequent production.

In view of the disadvantages of using the above lasers, ROC (TW) Patent Publication No. 350797 provides a processing method for removing particles in the semiconductor industry, and particularly for removing silicon particles generated after making a mark with a laser on the chip. In the method, the wetting and catalytic effects are achieved with the hydroxyl in the aqueous ammonia, so as to oxidize the particles. ROC (TW) Patent Publication No. 434749 provides a marking method, in which the wafer mark can be recovered after a chemical-mechanical polishing process is performed on the wafer, and no silicon particles are generated during the marking. According to the method, the photoresist is exposed with a fiber optic cable, so as to form a mark on the photoresist, and a wafer mark is formed subsequently by etching with the photoresist having a mark formed thereon as a mask. ROC (TW) Patent Publication No. 359885 provides a method, in which a mark pattern on a tape is defined with a laser beam, then the tape is adhered onto a silicon wafer, then the pattern is transferred to the wafer by a wet or dry process, and the tape is finally stripped to finish making a mark on the silicon wafer. The above method can avoid causing splashing fragments.

In Japanese Patent Publication No. 11-260675, a spot-shaped mark is fabricated on a silicon wafer with a laser, and a layer of transparent thin film is formed thereon. When a laser beam passes through the transparent thin film to make the spot-shaped mark regionally melt and deformed, a plurality of spot-shaped marks can be formed. This method can prevent the splashing fragments generated during the laser processing from being attached to the silicon wafer, and the definition and visibility are ensured by the shape of these spot-shaped marks.

ROC (TW) Patent Publication No. I233197 provides a chip scale mark and a marking method of the same. According to the method, when a laser beam ablates the surface of a silicon wafer, the chip size mark is used to stably keep the laser system and the marking distance between the wafers by removing the wafer warp on the wafer support. ROC (TW) Patent Publication No. 200538304 provides a method for making a mark by forming an interference fringe on a body to be marked with a laser beam.

Therefore, it is necessary to provide a method for forming a mark on the surface of a $CO_2$ laser-transparent material e.g. silicon to solve the above problems.

SUMMARY OF THE INVENTION

The present invention provides a method for forming a mark. The method includes the following steps: providing a first substrate, which has a top surface and a bottom surface; providing a second substrate, which has a top surface; disposing the bottom surface of the first substrate on the top surface of the second substrate; irradiating a $CO_2$ laser to the top surface of the second substrate by passing through the top surface and the bottom surface of the first substrate; and forming a mark on the bottom surface of the first substrate. The material of the mark is oxide of the second substrate or the same as the material of the second substrate.

The present invention also provides a method for forming a mark. The method includes the following steps: providing a first substrate, which has a top surface and a bottom surface; providing a second substrate, which has a top surface; forming a metal film on the top surface of the second substrate; disposing the bottom surface of the first substrate on the metal film; irradiating a $CO_2$ laser to the metal film by passing through the top surface and the bottom surface of the first substrate; and forming a mark on the bottom surface of the first substrate. The material of the mark is a mixture. The mixture includes metal and the second substrate.

The present invention further provides a substrate having a mark on the surface thereof. A substrate has a surface, wherein the material of the substrate is a $CO_2$ laser-transparent material; and a mark located on the surface of the substrate, wherein the mark is formed by a $CO_2$ laser, and the material of the mark is a $CO_2$ laser-absorption material.

In the present invention, the $CO_2$ laser with a light wavelength of 10.6 μm is not absorbed by the first substrate, e.g. silicon material, solar energy wafer or solar energy chip, but can pass through the first substrate and absorbed by the metal film and the second substrate, e.g. glass, silica, metal oxide, ceramics, nitride, carbide or polymethyl methacrylate (PMMA). Thus, the mark is formed by the re-solidification of the melted and/or vaporized material of the second substrate generated by the second substrate under the input irradiation energy of the $CO_2$ laser. Alternatively, the mark is formed by the re-solidification of the melted and/or vaporized mixture generated by the metal film and the second substrate under the input irradiation energy of the $CO_2$ laser. The $CO_2$ laser is the cheapest laser among various lasers, so the present invention provides a method for marking the $CO_2$ laser-transparent material, such as the wafer, in a rapid and simple way, which costs less, consumes less energy, and has high reliability and quality. Moreover, stress can be avoided by utilizing low energy means of marking, such that the first substrate, e.g. silicon material, solar energy wafer or solar energy chip, will not be deformed or warped. Further, the present invention does not utilize the laser beam in such a way of ablation, therefore the first substrate will not be damaged after the processing, and no splashing fragments and dusts will be generated, thereby abating pollution and improving yield. Besides, it is not necessary to use a mask, and the photolithography process may not be affected, such that the capacity is improved. Additionally, when marked incorrectly with other lasers, the surface of the wafer product is usually damaged. However, in the present invention, the $CO_2$ laser is employed, and a common chemical can be used to erase the incorrect mark so that the first substrate, e.g. silicon material, solar energy wafer or solar energy chip, may be recycled.

DETAILED DESCRIPTION OF THE INVENTION

Figure 1:
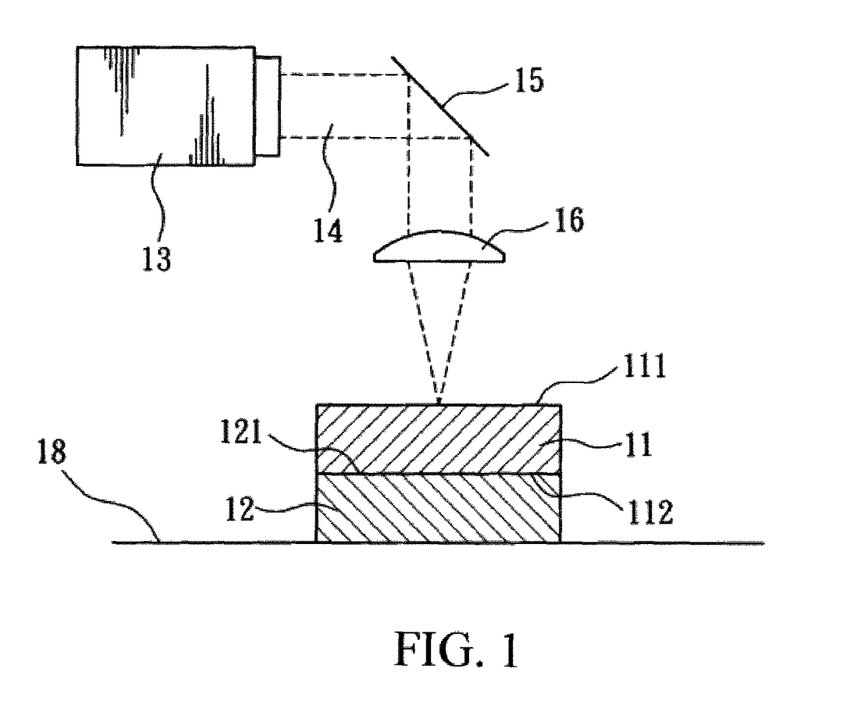
FIG. 1 is a schematic diagram of a method for forming a mark according to a first embodiment of the present invention.

FIG. 1 is a schematic diagram of a method for forming a mark according to a first embodiment of the present invention. In this embodiment, firstly, a first substrate 11 is provided, which has a top surface 111 and a bottom surface 112. In this embodiment, the material of the first substrate 11 is a $CO_2$ laser-transparent material. That is, the $CO_2$ laser transmittance of the first substrate 11 is higher than the $CO_2$ laser absorptance of the first substrate 11. The $CO_2$ laser transmittance of the first substrate 11 can be over 50 percent. Preferably, the $CO_2$ laser transmittance of the first substrate 11 is over 80 percent. In other words, the absorption band at 10.6 μm of the first substrate 11 is weak in the IR spectrum due to low absorption coefficient. Herein, the first substrate 11 can be a silicon wafer, which can be pure silicon or have a multi-layered thin film. Additionally, the first substrate 11 can also be a silicon chip, a solar energy wafer or a solar energy chip. In this embodiment, the first substrate 11 is disposed with a polished surface facing upward (i.e., the top surface 111 of the first substrate 11 is a polished surface) or with a rough surface facing upward (i.e., the bottom surface 112 of the first substrate 11 is a polished surface). Alternatively, the first substrate 11 can be a double-side polished substrate (i.e., the top surface 111 and the bottom surface 112 of the first substrate 11 both are polished surfaces). Preferably, the bottom surface 112 of the first substrate 11 is a polished surface.

Next, a second substrate 12 is provided, which has a top surface 121. In this embodiment, the material of the second substrate 12 is a $CO_2$ laser-absorption material. That is, the $CO_2$ laser absorptance of the second substrate 12 is higher than the $CO_2$ laser transmittance of the second substrate 12. The $CO_2$ laser absorptance of the second substrate 12 can be over 50 percent. Preferably, the $CO_2$ laser absorptance of the second substrate 12 is over 80 percent. In other words, the absorption band at 10.6 μm of the second substrate 12 is intense in the IR spectrum due to high absorption coefficient. Herein, the material of the second substrate 12 can be glass, silica, metal oxide, ceramics, nitride, carbide or polymethyl methacrylate (PMMA). Afterward, the bottom surface 112 of the first substrate 11 is disposed on the top surface 121 of the second substrate 12, and the top surface 121 of the second substrate 12 is closely attached to the bottom surface 112 of the first substrate 11. In this embodiment, a clamp (not shown) is used to clamp the second substrate 12 and the first substrate 11, such that the top surface 121 of the second substrate 12 is closely attached to the bottom surface 112 of the first substrate 11. Next, the second substrate 12 and the first substrate 11 are disposed on a support platform 18.

After that, a $CO_2$ laser 14 is provided by a $CO_2$ laser generator 13. The $CO_2$ laser 14 is focused on the first substrate 11 through a focusing mechanism having a reflecting mirror 15 and a focusing lens 16. Then, the $CO_2$ laser 14 is irradiated to the top surface 121 of the second substrate 12 by passing through the top surface 111 and bottom surface 112 of the first substrate 11 since the $CO_2$ laser 14 is not absorbed by the first substrate 11, but the $CO_2$ laser 14 is absorbed by the second substrate 12. The irradiated portion of the second substrate 12 is melted and/or vaporized, and then re-solidified on the bottom surface 112 of the first substrate 11. Therefore, the part of the second substrate 12 is disposed on the bottom surface 112 of the first substrate 11 to form the mark. Accordingly, in this embodiment, the mark is not an-etched groove, but a protrusion. The material of the mark is an oxide of the second substrate 12 or same as the material of the second substrate 12. The mark is formed by the re-solidification of the melted and/or vaporized material of the second substrate 12 generated by the second substrate 12 under the input irradiation energy of the $CO_2$ laser 14 or formed by the oxide of the second substrate 12.

In addition, the mark is formed by irradiating the $CO_2$ laser 14 less than five passes to prevent the $CO_2$ laser 14 from damaging the first substrate 11, especially the top surface 111. Moreover, the mark can be of any shape, such as a numeral, a letter or a totem.

Further, in this embodiment, the $CO_2$ laser 14 can be focused on the interior, the top surface 111 or the bottom surface 112 of the first substrate 11. The focusing position of the $CO_2$ laser 14 can be adjusted with the reflecting mirror 15 and the focusing lens 16, or controlled by adjusting the direction of Z-axis of the support platform 18, and the two methods for adjusting focusing position can be integrated. In addition, the focusing position of the $CO_2$ laser 14 would affect the effective energy density for melting/evaporating the second substrate 12. Herein, the effective energy density of focusing position is higher than other divergent defocus position. In FIG. 1, the focusing position is on the top surface 111 of the first substrate 11 which will has higher effective energy density than the interior or the bottom surface 112 of the first substrate 11. We can also adjust the focusing position at the bottom surface 112 of the first substrate 11 for more effective energy density for marking. In this embodiment, the $CO_2$ laser 14 is focused on the top surface 111 of the first substrate 11. By adjusting appropriate laser processing parameters, such as, the power of the $CO_2$ laser source, scanning speed, pass number (about less than five passes), and together by scanning the laser spot or moving the support platform 18, a desired mark shape can be achieved.

Additionally, if a part or the whole of the mark is undesired or incorrect, a cleaning chemical can be used to directly erase the mark. The chemical cleaning agent can be hydrofluoric acid (HF), buffered oxide etching (BOE), or a general chemical capable of erasing oxide.

Hereinafter is an example of the experiment according to this embodiment. The first substrate 11 is a silicon wafer and the second substrate 12 is a glass substrate. The processing condition of this example is: the thicknesses of the first substrate 11 and the second substrate 12 are both 500 μm; the power of the $CO_2$ laser 14 is 21 W and the focus point thereof is set on the top surface 111 of the first substrate 11; the mark is directly formed by irradiating the $CO_2$ laser 14 once at a scanning speed of 5 mm/sec, and the processing result is shown in FIG. 2.

Figure 2:
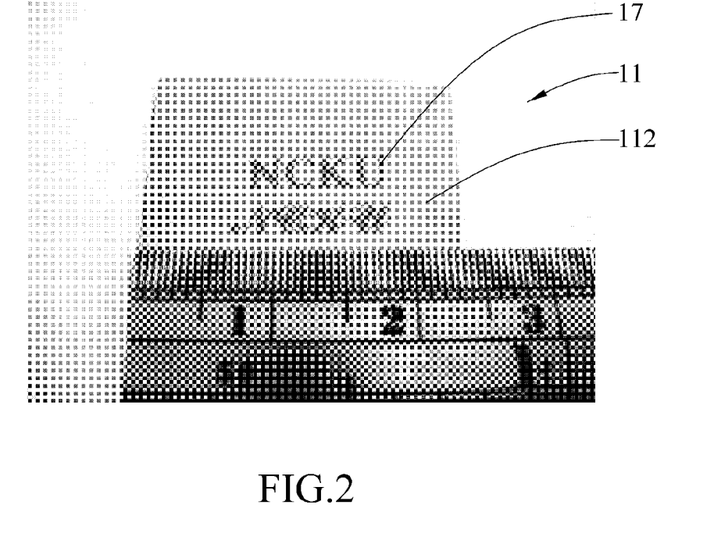
FIG. 2 is a photograph of the silicon wafer having a mark on the surface thereof formed according to an example of the experiment in the first embodiment of the present invention, in which the mark is constituted by letters.
Figure 3:
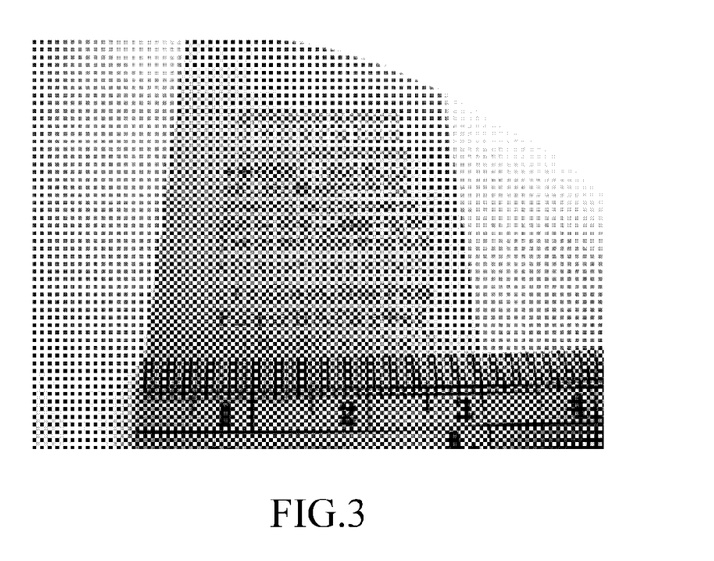
FIG. 3 is a photograph of the silicon wafer having a mark on the surface thereof formed according to the example of the experiment in the first embodiment of the present invention, in which the mark is constituted by totems and random codes.

As shown in FIG. 2, the silicon wafer includes a silicon material 11 and a mark 17. The silicon material 11 has a surface 112 (i.e., the bottom surface 112 in FIG. 1). In this example, the surface 112 is a polished surface, and it is to be understood that the surface 112 can also be a rough surface. The mark 17 is located on the surface 112 of the silicon material 11, and the mark 17 is silicon oxide, which can be constituted by numerals, letters, or totems. In this example, the mark 17 is constituted by letters of "NCKU." Also, the mark is other totems or random codes, as shown in FIG. 3.

Figure 4:
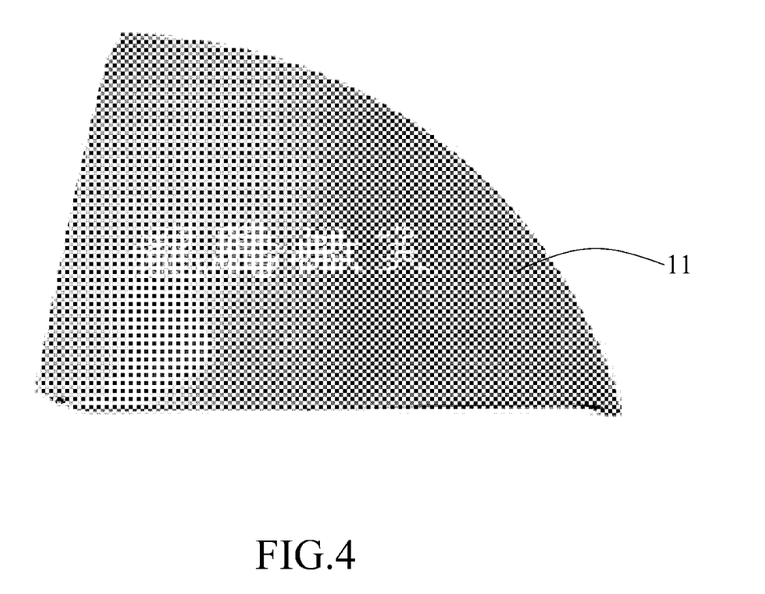
FIG. 4 is a photograph of the first substrate having a mark on the surface thereof formed according to another example of the experiment in the first embodiment of the present invention, in which the mark is constituted by four Chinese character.
Figure 5:
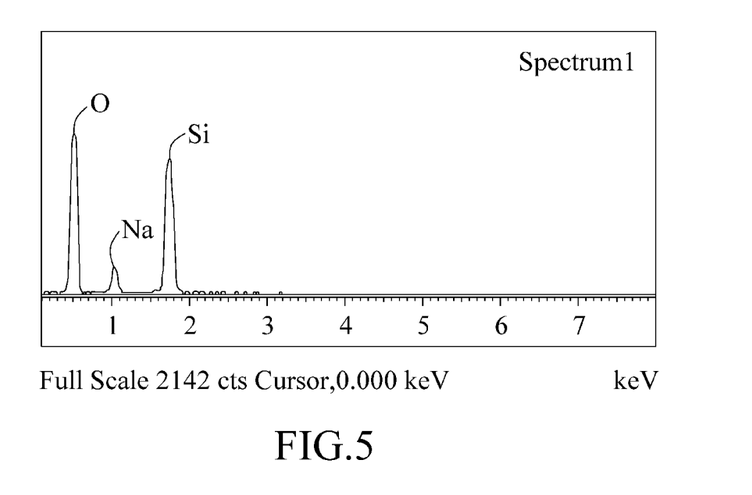
FIG. 5 is a photograph showing the material composition of the mark analyzed according to the EDX analysis.
Figure 6:
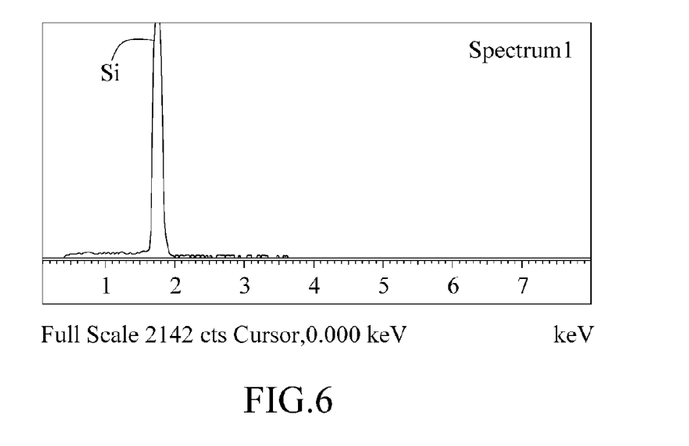
FIG. 6 is a photograph showing the material of the portion without the mark analyzed according to the EDX analysis.
Figure 7:
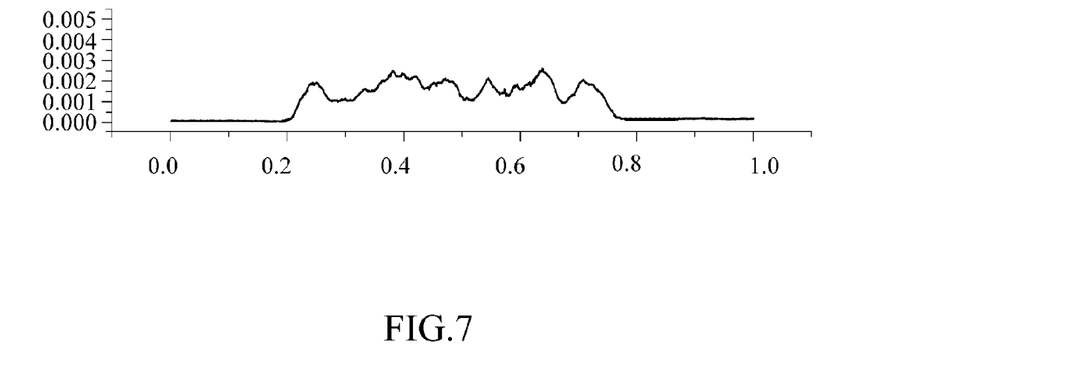
FIG. 7 is a photograph showing the mark measured by an alpha-step profilometer.

Further, hereinafter is another example of the experiment according to this embodiment. In this example, the first substrate 11 is a silicon wafer and the second substrate 12 is a pyrex glass substrate. Then, the first substrate 11 and the second substrate 12 are irradiated and scanned by the $CO_2$ laser one time. As a result, a four Chinese character mark is formed on the surface of the first substrate 11, as shown in FIG. 4. And, the material of the mark comprises Si, O and Na, as shown in the EDX analysis in FIG. 5, which consists of the primary material composition of the Pyrex glass. The material of the portion without the mark is only silicon (Si), as shown in the EDX analysis in FIG. 6. The profile of the mark measured by an alpha-step profilometer is shown in FIG. 7, which confirms that the mark protrudes from the surface of the silicon wafer.

Figure 8:
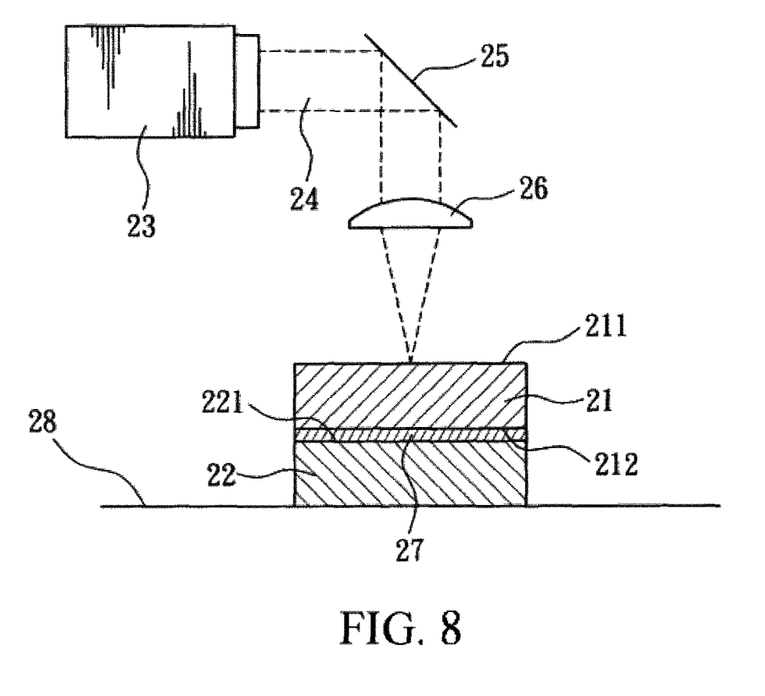
FIG. 8 is a schematic diagram of a method for forming a mark according to a second embodiment of the present invention.

FIG. 8 is a schematic diagram of a method for forming a mark according to a second embodiment of the present invention. In this embodiment, firstly, a first substrate 21 is provided, which has a top surface 211 and a bottom surface 212. In this embodiment, the material of the first substrate 21 is a $CO_2$ laser-transparent material. That is, the $CO_2$ laser transmittance of the first substrate 21 is higher than the $CO_2$ laser absorptance of the first substrate 21. The $CO_2$ laser transmittance of the first substrate 21 can be over 50 percent. Preferably, the $CO_2$ laser transmittance of the first substrate 21 is over 80 percent. In other words, the absorption band at 10.6 μm of the first substrate 21 is weak in the IR spectrum due to low absorption coefficient. Herein, the first substrate 21 is a silicon wafer, which can be pure silicon or have a multi-layered thin film. Additionally, the first substrate 21 can also be a silicon chip, a solar energy wafer or a solar energy chip. In this embodiment, the first substrate 21 is disposed with a polished surface facing upward (i.e., the top surface 211 of the first substrate 21 is a polished surface) or a rough surface facing upward (i.e., the bottom surface 212 of the first substrate 21 is a polished surface). Alternatively, the first substrate 21 can be a double-side polished substrate (i.e., the top surface 211 and the bottom surface 212 of the first substrate 21 both are polished surfaces). Preferably, the bottom surface 212 of the first substrate 21 is a polished surface.

Next, a second substrate 22 is provided, which has a top surface 221. In this embodiment, the material of the second substrate 22 is a $CO_2$ laser-absorption material. Herein, the material of the second substrate 12 can be glass, silica, metal oxide, ceramics, nitride, carbide or polymethyl methacrylate (PMMA). That is, the $CO_2$ laser absorptance of the second substrate 22 is higher than the $CO_2$ laser transmittance of the second substrate 22. The $CO_2$ laser absorptance of the second substrate 22 can be over 50 percent. Preferably, the $CO_2$ laser absorptance of the second substrate 22 is over 80 percent. In other words, the absorption band at 10.6 μm of the second substrate 22 is intense in the IR spectrum due to high absorption coefficient. Afterward, a metal film 27 is formed on the top surface 221 of the second substrate 22. Preferably, the metal film 27 is formed on the top surface 221 of the second substrate 22 by coating, and the material of the metal film 27 can be selected from a group consisting of aluminum, titanium, chromium, tantalum, nickel, iron, cobalt, vanadium, tungsten, zirconium, zinc, copper, silver, and gold. The thickness of the metal film 27 can be between 10-1000 nm. Preferably, the material of the metal film 27 is aluminum, titanium, chromium, tantalum, nickel, iron, cobalt, vanadium, tungsten, zirconium or zinc, and the thickness thereof is between 30-80 nm.

Afterward, the bottom surface 212 of the first substrate 21 is disposed on the metal film 27 coated on the second substrate 22. And the top surface 221 of the second substrate 22, the metal film 27, and the bottom surface 212 of the first substrate 21 are closely attached. In this embodiment, a clamp (not shown) is used to clamp the second substrate 22 and the first substrate 21. Next, the second substrate 22 and the first substrate 21 are disposed on a support platform 28.

Afterward, a $CO_2$ laser 24 is provided by a $CO_2$ laser generator 23. Finally, the $CO_2$ laser 24 is focused on the first substrate 21 through a focusing mechanism having a reflecting mirror 25 and a focusing lens 26. Then, the $CO_2$ laser 24 is irradiated to the metal film 27 by passing through the top surface 211 and bottom surface 212 of the first substrate 21 since the $CO_2$ laser 24 is not absorbed by the first substrate 21, but the $CO_2$ laser 24 is absorbed by the metal film 27 and the second substrate 22. When the $CO_2$ laser 24 irradiates to the metal film 27, the heat caused by the $CO_2$ laser can be conducted to the top surface 221 of the second substrate 22 to cause the corresponding portion of the second substrate 22 melt and/or vaporize. Of course, when the metal film 27 is thin enough, the $CO_2$ laser 24 may pass through the metal film 27 and irradiate to the top surface 221 of the second substrate 22. Accordingly, the irradiated portion of the metal film 27 and the corresponding portion of the second substrate 22 are melted and/or vaporized, and then re-solidified on the bottom surface 212 of the first substrate 21. Therefore, the part of the metal film 27 and the second substrate 12 are disposed on the bottom surface 212 of the first substrate 21 to form the mark. The mark formed by growing or depositing, which is formed by utilizing the input irradiation energy of the $CO_2$ laser to melt and/or vaporize the metal film 27 and the top surface 221 of the second substrate 22, and then re-solidifying the both. Thus, the mark is not an etched groove, but a protrusion. The material of the mark is a mixture, and the mixture includes metal and the second substrate. Of course, the mixture may also include metal oxide or the oxide of the second substrate 22.

Moreover, the mark can be of any shape, such as a numeral, a letter, or a totem. In addition, the mark is formed by irradiating the $CO_2$ laser 24 less than five passes to prevent the $CO_2$ laser 24 from damaging the top surface 211 of the first substrate 21.

Further, in this embodiment, the $CO_2$ laser 24 can be focused on the interior, the top surface 211 or the bottom surface 212 of the first substrate 21. The focusing position of the $CO_2$ laser 24 can be adjusted with the reflecting mirror 25 and the focusing lens 26, or controlled by adjusting the direction of Z-axis of the support platform 28, and the two methods for adjusting focusing position can be integrated. In addition, the focusing position of the $CO_2$ laser 24 would affect the effective energy density for melting/evaporating the second substrate 22. Herein, the effective energy density of focusing position is higher than other divergent defocus position. In FIG. 8, the focusing position is on the top surface 211 of the first substrate 21 which will has higher effective energy density than the interior or the bottom surface 212 of the first substrate 21. We can also adjust the focusing position at the bottom surface 212 of the first substrate 21 for more effective energy density for marking. In this embodiment, the $CO_2$ laser 24 is focused on the top surface 211 of the first substrate 21. By adjusting appropriate laser processing parameters, such as, the power of the $CO_2$ laser source, scanning speed pass number (about less than five passes), and together by scanning the laser spot or moving the support platform 28, a desired mark shape can be achieved.

Additionally, if a part or the whole of the mark is undesired or incorrect, a cleaning chemical can be used to directly erase the mark. The chemical cleaning agent can be hydrofluoric acid (HF), buffered oxide etching (BOE), or a general chemical capable of erasing oxide.

Figure 9:
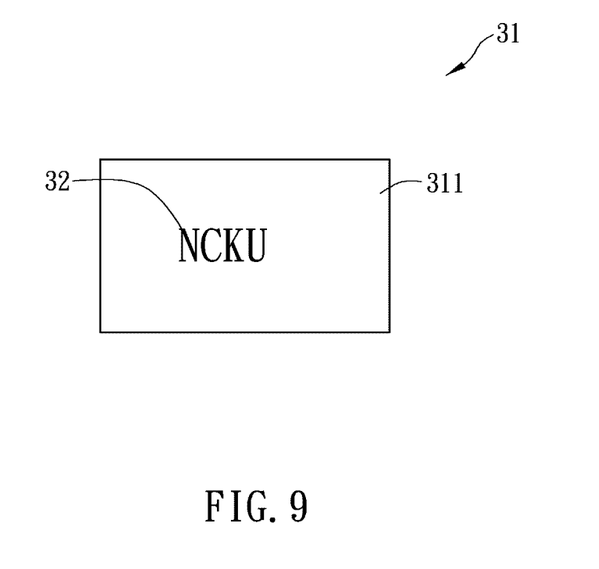
FIG. 9 is a schematic diagram of a substrate having a mark on the surface thereof according to a third embodiment of the present invention.

FIG. 9 is a schematic diagram of a substrate having a mark on the surface thereof according to a third embodiment of the present invention. In this embodiment, a substrate 31 has a surface 311, and the material of the substrate 31 is a $CO_2$ laser-transparent material. That is, the $CO_2$ laser transmittance of the substrate 31 is higher than the $CO_2$ laser absorptance of the substrate 31. The $CO_2$ laser transmittance of the substrate 31 can be over 50 percent. Preferably, the $CO_2$ laser transmittance of the substrate 31 is over 80 percent. In other words, the absorption band at 10.6 μm of the substrate 31 is weak in the IR spectrum due to low absorption coefficient. A mark 32 is located on the surface 311 of the substrate 31. Herein, the mark 32 is formed by a $CO_2$ laser, and the material of the mark 32 is a $CO_2$ laser-absorption material. That is, the $CO_2$ laser absorptance of the mark 32 is higher than the $CO_2$ laser transmittance of the mark 32. The $CO_2$ laser absorptance of the mark 32 can be over 50 percent. Preferably, the $CO_2$ laser absorptance of the mark 32 is over 80 percent. In other words, the absorption band at 10.6 μm of the mark 32 is intense in the IR spectrum due to high absorption coefficient.

In this embodiment, the material of the mark 32 can be metal, metal oxide, nitride, carbide or silicon oxide or the mixture at least selected from two of the above material, and the substrate 31 is a silicon wafer or a silicon chip. Herein, the silicon wafer can be pure silicon or has a multi-layered thin film. And, the surface 311 of the substrate 31 can be a polished surface. In the embodiment, the features and the functions of the substrate 31 and the mark 32 are same as those of the first substrate 11 and the mark in the first embodiment, and are also same as those of the first substrate 21 and the mark in the second embodiment. Those features and functions are described above. Therefore, unnecessary details are not going to be mentioned here.

In the present invention, the $CO_2$ laser with a light wavelength of 10.6 μm is not absorbed by the first substrate, e.g. silicon material, solar energy wafer or solar energy chip, but can pass through the first substrate and absorbed by the metal film and the second substrate, e.g. glass, silica, metal oxide, ceramics, nitride, carbide or polymethyl methacrylate (PMMA). Thus, the mark is formed by the re-solidification of the melted and/or vaporized material of the second substrate generated by the second substrate under the input irradiation energy of the CO) laser or the mark is the oxide of the second substrate. Alternatively, the mark is formed by the re-solidification of the melted and/or vaporized mixture generated by the metal film and the second substrate under the input irradiation energy of the $CO_2$ laser. The present invention has the following advantages: 1. the $CO_2$ laser is the cheapest laser among various lasers; 2. the present invention provides a method for marking the wafer in a rapid and simple way, which costs less, consumes less energy, and has high reliability and quality; 3. stress can be avoided by utilizing low energy, such that the first substrate 11, e.g. silicon material, a solar energy wafer and a solar energy chip, will not be deformed or warped; 4. the present invention does not adopt the laser beam in the manner of ablation, such that the wafer will not be damaged after the processing, and no splashing fragments and dusts will be generated, thereby abating pollution and improving the yield; 5. it is not necessary to use a mask, and the photolithography process may not be affected, such that the capacity is improved; 6. the first substrate 11 can be a silicon wafer of pure silicon, and can also be a silicon wafer with a multi-layered thin film; 7. when marked incorrectly, as other lasers are used in the conventional art, the incorrect mark cannot be erased from the surface of the damaged product (for example, an etched groove is resulted). However, in the present invention, a $CO_2$ laser is used to generate a mark of silicon oxide, and a common chemical can be used to erase the incorrect mark for recycling the first substrate 11.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope as defined in the appended claims.

What is claimed is:

1. A method for forming a mark, comprising:
   providing a first substrate, wherein the first substrate has a top surface and a bottom surface;
   providing a second substrate, wherein the second substrate has a top surface;
   disposing the bottom surface of the first substrate on the top surface of the second substrate;
   irradiating a $CO_2$ laser to the top surface of the second substrate by passing through the top surface and the bottom surface of the first substrate; and
   forming, without deformation of the first substrate, a mark on the bottom surface of the first substrate, wherein the material of the mark is oxide of the second substrate or same as the material of the second substrate.

2. The method as claimed in claim 1, wherein the material of the first substrate is a $CO_2$ laser-transparent material, and the material of the second substrate is a $CO_2$ laser-absorption material.

3. The method as claimed in claim 1, wherein the $CO_2$ laser transmittance of the first substrate is higher than the $CO_2$ laser absorptance of the first substrate, the $CO_2$ laser absorptance of the second substrate is higher than the $CO_2$ laser transmittance of the second substrate.

4. The method as claimed in claim 1, wherein the mark is formed by irradiating the $CO_2$ laser less than five passes.

5. The method as claimed in claim 1, wherein the first substrate is a silicon wafer, a silicon chip, a solar energy wafer or a solar chip.

6. The method as claimed in claim 5, wherein the silicon wafer is pure silicon.

7. The method as claimed in claim 5, wherein the silicon wafer has a multi-layered thin film.

8. The method as claimed in claim 5, wherein the top surface or the bottom surface of the silicon wafer is a polished surface.

9. The method as claimed in claim 1, wherein the material of the second substrate is selected from a group consisting of glass, silica, metal oxide, ceramics, nitride, carbide and polymethyl methacrylate (PMMA).

10. The method as claimed in claim 1, wherein the $CO_2$ laser is focused on the interior, the top surface or bottom surface of the first substrate, 11. The method as claimed in claim 1, further comprising a step of erasing at least one part of the mark with a chemical after the step of forming the mark.

12. The method as claimed in claim 11, wherein the chemical is hydrofluoric acid (HF) or buffered oxide etching (BOE).

13. The method as claimed in claim 1, wherein the mark is formed by the re-solidification of the melted and/or vaporized material of the second substrate generated by the second substrate under the input irradiation energy of the $CO_2$ laser 14. A method for forming a mark, comprising:
    providing a first substrate, wherein the first substrate has a top surface and a bottom surface;
    providing a second substrate, wherein the second substrate has a top surface;
    forming a metal film on the top surface of the second substrate;
    disposing the bottom surface of the first substrate on the metal film;
    irradiating a $CO_2$ laser to the metal film by passing through the top surface and the bottom surface of the first substrate; and
    forming a mark on the bottom surface of the first substrate, wherein the material of the mark is a mixture, the mixture includes metal and the material of the second substrate.

15. The method as claimed in claim 14, wherein the material of the first substrate is a $CO_2$ laser-transparent material, and the metal film and the second substrate are $CO_2$ laser-absorption materials, 16. The method as claimed in claim 14, wherein the $CO_2$ laser transmittance of the first substrate is higher than the $CO_2$ laser absorptance of the first substrate, the $CO_2$ laser absorptance of the second substrate is higher than the $CO_2$ laser transmittance of the second substrate.

17. The method as claimed in claim 14, wherein the mark is formed by irradiating the $CO_2$ laser less than five passes.

18. The method as claimed in claim 14, wherein the first substrate is a silicon wafer, a silicon chip, a solar energy wafer or a solar chip.

19. The method as claimed in claim 18, wherein the silicon wafer is pure silicon.

20. The method as claimed in claim 18, wherein the silicon wafer has a multi-layered thin film.

21. The method as claimed in claim 18, wherein the top surface or the bottom surface of the silicon wafer is a polished surface.

22. The method as claimed in claim 14, wherein the material of the second substrate is selected from a group consisting of glass, silica, metal oxide, ceramics, nitride, carbide and polymethyl methacrylate (PMMA).

23. The method as claimed in claim 14, wherein the $CO_2$ laser is focused on the interior, the top surface or bottom surface of the first substrate.

24. The method as claimed in claim 14, further comprising a step of erasing at least one part of the mark with a chemical after the step of forming the mark.

25. The method as claimed in claim 24, wherein the chemical is hydrofluoric acid (HF) or buffered oxide etching (BOE).

26. The method as claimed in claim 14, wherein the mark is formed by the re-solidification of the melted and/or vaporized material of the mixture generated by the metal film and the second substrate under the input irradiation energy of the $CO_2$ laser.

27. The method as claimed in claim 14, wherein the mixture further comprises the metal oxide.

* * * * *